United States Patent
Gohel et al.

(10) Patent No.: US 11,899,056 B2
(45) Date of Patent: Feb. 13, 2024

(54) COMMUNICATING USING CONTACTLESS COUPLING

(71) Applicant: Teradyne, Inc., North Reading, MA (US)

(72) Inventors: Tushar K. Gohel, North Reading, MA (US); Thomas D. Jacobs, North Reading, MA (US); David H. Vandervalk, North Reading, MA (US); Jason L. Welch, North Reading, MA (US)

(73) Assignee: TERADYNE, INC., North Reading, MA (US)

( * ) Notice: Subject to any disclaimer, the term of this patent is extended or adjusted under 35 U.S.C. 154(b) by 0 days.

(21) Appl. No.: 17/686,768

(22) Filed: Mar. 4, 2022

(65) Prior Publication Data
US 2023/0280393 A1    Sep. 7, 2023

(51) Int. Cl.
*G01R 31/28* (2006.01)

(52) U.S. Cl.
CPC ..... *G01R 31/2834* (2013.01); *G01R 31/2839* (2013.01)

(58) Field of Classification Search
None
See application file for complete search history.

(56) References Cited

U.S. PATENT DOCUMENTS

| | | | |
|---|---|---|---|
| 6,563,352 B1 | 5/2003 | Gohel et al. | |
| 2004/0056666 A1 | 3/2004 | Gohel | |
| 2005/0146320 A1 | 7/2005 | Gohel | |
| 2006/0161827 A1 | 7/2006 | Gohel et al. | |
| 2009/0091347 A1 | 4/2009 | Gohel et al. | |
| 2011/0204910 A1* | 8/2011 | Suto | G01R 31/2815 29/829 |
| 2012/0106351 A1 | 5/2012 | Gohel et al. | |
| 2013/0106399 A1 | 5/2013 | Gohel et al. | |
| 2013/0124134 A1 | 5/2013 | Gohel | |
| 2013/0334890 A1 | 12/2013 | Fricker | |
| 2015/0028908 A1* | 1/2015 | Kushnick | G06F 11/2221 324/750.05 |
| 2016/0092390 A1 | 3/2016 | Grothen et al. | |
| 2018/0316420 A1 | 11/2018 | Gohel et al. | |
| 2018/0316421 A1 | 11/2018 | Gohel et al. | |
| 2018/0316423 A1 | 11/2018 | Gohel et al. | |

(Continued)

OTHER PUBLICATIONS

Extended European Search Report in Application No. 23159333.6 dated Jul. 28, 2023 (9 pages).

*Primary Examiner* — Patrick Assouad
*Assistant Examiner* — Haidong Zhang
(74) *Attorney, Agent, or Firm* — Burns & Levinson LLP

(57) ABSTRACT

An example system includes a first circuit board having first conductive traces, where a first conductive trace is for conducting an alternating current (AC) digital signal having an edge; a second circuit board having second conductive traces, where a second conductive trace is within a predefined distance of the first conductive trace to produce a contactless coupling with the first conductive trace, and where the contactless coupling enables electrical energy on the first conductive trace to manifest on the second conductive trace as a transient response that is based on the edge; and circuitry to reconstruct the edge based on the transient response from the second conductive trace.

31 Claims, 15 Drawing Sheets

(56) References Cited

U.S. PATENT DOCUMENTS

2018/0316424 A1  11/2018  Gohel et al.
2018/0316990 A1  11/2018  Gohel et al.
2019/0033372 A1   1/2019  Gohel et al.
2021/0194595 A1   6/2021  Gohel et al.

* cited by examiner

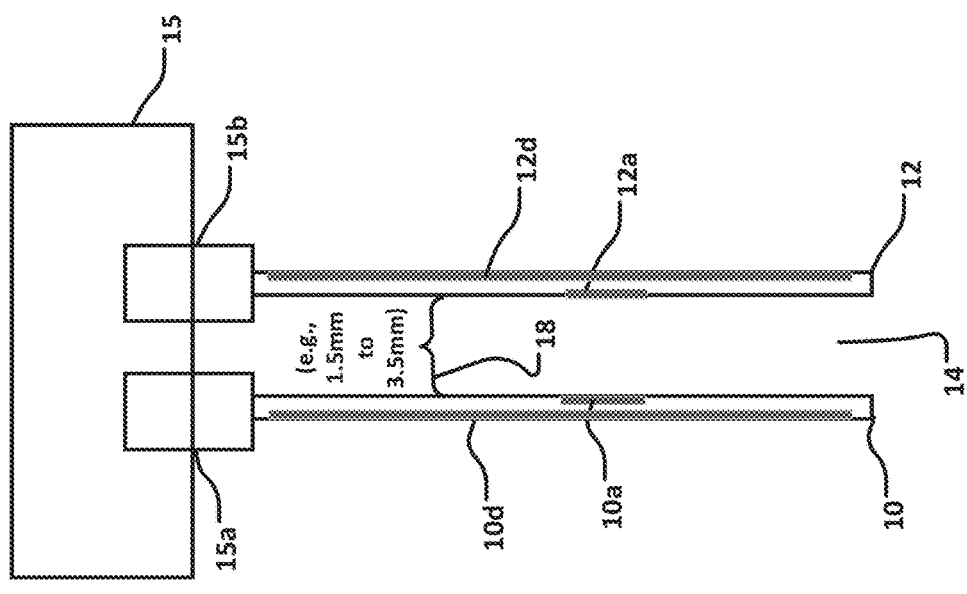

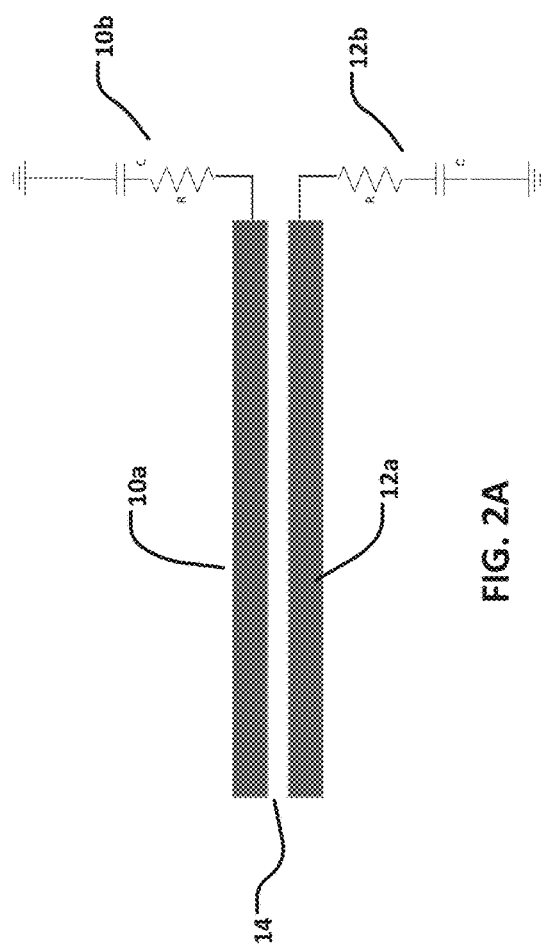
FIG. 2A
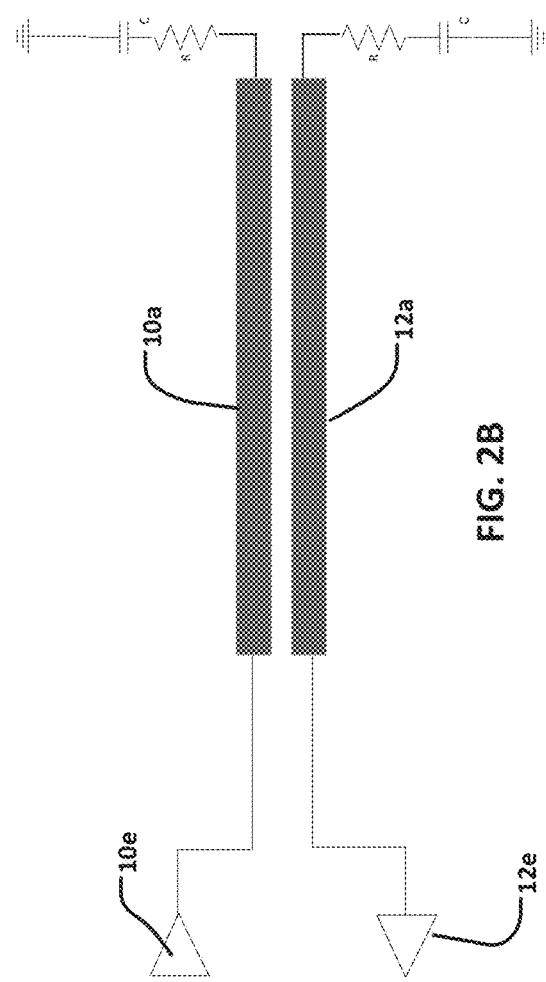
FIG. 2B
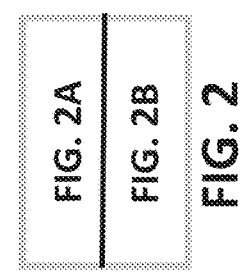

COMMUNICATING USING CONTACTLESS COUPLING

TECHNICAL FIELD

This specification describes example implementations of systems that enable communication between devices using contactless coupling.

BACKGROUND

Test systems, such as automatic test equipment (ATE), are configured to test the operation of electronic devices referred to as devices under test (DUTs). A test system may include test instruments to send signals, including digital signals, to a DUT for testing. Example ATE includes a backplane into which individual printed circuit boards or "cards" may be inserted or "plugged-in" in order to expand capabilities of the ATE. An example includes a standard PXI chassis that has a backplane that supports multiple cards to configure the ATE. In an example, an ATE manufacturer designs a communication channel card that supports 32 channels. If the customer wants the ATE to include 192 channels, six channel cards may be added to the backplane. In order to have all of those channels operate as a unit, high-speed communication should take place between the cards in the backplane so that tests can run seamlessly and with low relatively latency. In some prior systems that include multiple cards in the backplane, slot to slot communication either happened through connections on the backplane or connections made through a front panel. In an example, the standard PXI chassis does not support the ability to communicate between cards using the desired timing. Front panel communication is expensive and cumbersome for the user, since the user would have to disconnect and to reconnect cables every time cards are removed or added.

SUMMARY

In an example test system, devices such as circuit boards (or "cards"), are plugged into a backplane directly to the right or to the left of other devices. When circuit boards are plugged into the backplane, they are mechanically aligned perpendicularly to the backplane and aligned in parallel with other circuit boards in the backplane. Software recognizes a configuration of the system by reading from the circuit boards in the backplane and enables or permits communication between circuit boards in the direction where there are adjacent circuit boards. An air space between the circuit boards is small to allow for the communication using contactless coupling. Since the circuit boards are mechanically aligned, conductive traces on individual circuit boards are arranged such that a transient response of a digital signal on a transmitting signal trace of a first circuit board can be coupled to a receiving signal trace of a second circuit board, where the air acts as the communication dielectric medium. Circuitry interprets the transient response on the receiving signal trace and reconstructs the original transmitted digital signal on the second circuit board. The digital signal is reconstructed using the transient characteristics of the incoming edge of the original transmitted digital signal. So, the resulting communication may have no latency or less latency than is experienced using modulation/demodulation signaling architectures.

An example system of the preceding type may include a first circuit board having first conductive traces, where a first conductive trace is for conducting an alternating current (AC) digital signal having an edge; a second circuit board having second conductive traces, where a second conductive trace is within a predefined distance of the first conductive trace to produce a contactless coupling with the first conductive trace, and where the contactless coupling enables electrical energy on the first conductive trace to manifest on the second conductive trace as a transient response that is based on the edge; and circuitry to reconstruct the edge based on the transient response from the second conductive trace. The system may include one or more of the following features, either alone or in combination.

The edge is among edges in the AC digital signal and the edges may include a rising edge and a falling edge. The transient response may be based on the edges. The circuitry to reconstruct the ed may be configured to reconstruct the edges based on the transient response on the second conductive trace. The system may include a backplane configured to receive the first circuit board and the second circuit board. The second circuit board may include the circuitry to reconstruct the edge. The electrical energy on the first conductive trace may pass directly from the first trace to the second trace without the energy or related signals passing through the backplane.

The first conductive trace may be terminated to reduce at least one of electromagnetic interference or electromagnetic emissions and/or to maintain AC digital signal fidelity. The second conductive trace may be terminated reduce at least one of electromagnetic interference or electromagnetic emissions and/or to maintain AC digital signal fidelity. The first conductive trace may be part of a first differential transmission line comprised of the first conductive trace and a third conductive trace. The second conductive trace may be part of a second differential transmission line comprised of the second may trace and a fourth conductive trace. The third conductive trace may be for conducting second edges, where the second edges include a second rising edge and a second falling edge. The third conductive trace may be within a predefined distance of the fourth conductive trace to produce a second contactless coupling with the fourth conductive trace. The second contactless coupling may enable electrical energy on the third conductive trace to manifest on the fourth conductive trace as a second transient response that is based on the second edges. The second transient response may be part of a differential transient response. The circuitry to reconstruct the edge may be configured to reconstruct at least part of the AC digital signal based also on the second transient response. The circuitry to reconstruct the edge may include a receiver to receive the transient response. The predefined distance may be based on one or more of: a sensitivity of the receiver, a width of the first conductive trace, a width of the second conductive trace, or an electrical energy level of the AC signal.

The system may include a main circuit board. The first circuit board may be a companion board of the main circuit board. The main circuit board may include a connector to electrically connect a conductive trace on the main circuit board to the first conductive trace. The main circuit board may be beyond the predefined distance and the connector may be configured to position the first circuit board within the predefined distance. An example of the predefined distance may be between 1.5 millimeters (mm) and 3.5 mm.

The circuitry to reconstruct the edge may include a buffer having an input and outputs. The buffer may be configured to hold the outputs at a logic high level in response to a positive transient response and to hold the outputs at a logic low level in response to a negative transient response. The buffer may include a feedback circuit from an output of the buffer to the input. The buffer and the feedback circuit may be configured so that the logic high level applied to the input from the feedback circuit maintains the outputs at the logic high level until the negative transient response is received at the input. The buffer may be configured to have a propagation delay that is less than a width of the positive transient response. The feedback circuit may be configured to provide resistance that sets a threshold for changing logic levels of the outputs of the buffer.

The circuitry to reconstruct the edge may include a multiplexer to receive an output logic level from the buffer and control logic to select, for output, either the output logic level from the buffer or a signal provided by the control logic. The circuitry to reconstruct the edge may include a flip-flop circuit to receive an output of the multiplexer. The logic circuit may be configured to control timing of the flip-flop circuit to provide the output of the multiplexer to the second circuit board at a predefined timing.

The circuitry to reconstruct the edge may be configured to output a reconstructed version of at least part of the AC digital signal using reconstructed edges. The circuitry to reconstruct the edge may include an amplifier to increase a signal level of the transient response prior to the circuitry reconstructing the edges and/or an amplifier to increase a signal level of the least part of the AC digital signal before output to data bus.

The system may include a backplane configured to connect to the first circuit board and to the second circuit board. Contactless coupling may result from connection of the first circuit board and the second circuit board to the backplane. The transient response may include a positive pulse based on the rising edge and a negative pulse based on the falling edge. The circuitry to reconstruct the edge may be configured to produce a rising edge in response to the positive pulse and a falling edge in response to the negative pulse. The edge may correspond to data that is passed between the first circuit board and the second circuit board. The first circuit board may be in a first slot of the backplane and the second circuit board may be in a second slot of the backplane.

Example automatic test equipment (ATE) includes a system that includes a first circuit board having first conductive traces, where a first conductive trace is for conducting an AC digital signal having an edge; a second circuit board having second conductive traces, where a second conductive trace is within a predefined distance of the first conductive trace to produce a contactless coupling with the first conductive trace, and where the contactless coupling enables electrical energy on the first conductive trace to manifest on the second conductive trace as a transient response that is based on the edge; and circuitry to reconstruct the edge based on the transient response from the second conductive trace. The ATE also includes a first test instrument to test a device under test (DUT), where the first test instrument includes the first circuit board; a second test instrument to test the DUT, where the second test instrument includes the second circuit board; and a backplane connected to the first circuit board and the second circuit board. The second circuit board includes at least part of the circuitry to reconstruct the edge. The ATE may include any one or more of the preceding features, either alone or in combination.

Example ATE includes a system that includes a first circuit board having first conductive traces, where a first conductive trace is for conducting an AC digital signal having an edge; a second circuit board having second conductive traces, where a second conductive trace is within a predefined distance of the first conductive trace to produce a contactless coupling with the first conductive trace, and where the contactless coupling enables electrical energy on the first conductive trace to manifest on the second conductive trace as a transient response that is based on the edge; and circuitry to reconstruct the edge based on the transient response from the second conductive trace. The ATE also includes a test instrument to test a DUT, where the first test instrument includes the first circuit board and the second circuit board, and a backplane connected to the first circuit board and the second circuit board. The ATE may include any one or more of the preceding features, either alone or in combination.

An example method is for reconstructing a digital signal having a rising edge and a falling edge. The method includes the following operations: producing a first transient response corresponding to the rising edge of the digital signal, where the digital signal conducts through a first conductive trace on a first circuit board and the first transient response is produced on a second conductive trace on a second circuit board, the first conductive trace and the second conductive trace are in a contactless coupling that is based on proximity of the first conductive trace and the second conductive trace, and the contactless coupling enables the second conductive trace to produce the first transient response; generating a logic high level in response to the first transient response; producing a second transient response corresponding to the falling edge of the digital signal, where the second transient response is produced on the second conductive trace based on the contactless coupling; and generating a logic low level in response to the second transient response, thereby reconstructing at least part of the digital signal. The example method may include one or more of the following features, either alone or in combination.

The first conductive trace may be terminated to reduce at least one of electromagnetic interference or electromagnetic emissions and/or to maintain AC digital signal fidelity. The second conductive trace may be terminated reduce at least one of electromagnetic interference or electromagnetic emissions and/or to maintain AC digital signal fidelity. The first conductive trace may be part of a first differential transmission line. The second conductive trace may be part of a second differential transmission line. The method may be performed by circuitry that includes a buffer having an input and outputs. The buffer may be configured to hold the outputs at a logic high level in response to the first transient response and to hold the outputs to a logic low level in response to the second transient response. The buffer may include a feedback circuit from an output of the buffer to the input of the buffer. The buffer and the feedback circuit may be configured so that the logic high level applied to the input of the buffer from the feedback circuit maintains the outputs of the buffer at the logic high level until the second transient response is received. The buffer may be configured to have a propagation delay that is less than a width of the first transient response. The feedback circuit may be configured to provide resistance that sets a threshold for changing logic levels of the outputs of the buffer.

The first transient response may include a positive pulse and the second transient response comprises a negative pulse. The first transient response and the second transient response may be based on a differential signal.

Any two or more of the features described in this specification, including in this summary section, may be combined to form implementations not specifically described in this specification.

At least part of the devices, systems, methods, and techniques described in this specification may be configured or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the devices, systems, methods, and techniques described in this specification may be configured or controlled using a computing system comprised of one or more processing devices and memory storing instructions that are executable by the one or more processing devices to perform various control operations. The devices, systems, methods, and techniques described in this specification may be configured, for example, through design, construction, composition, arrangement, placement, programming, operation, activation, deactivation, and/or control.

The details of one or more implementations are set forth in the accompanying drawings and the following description. Other features and advantages will be apparent from the description and drawings, and from the claims.

DESCRIPTION OF THE DRAWINGS

FIG. 1 is a side view of two example circuit boards, each having a conductive trace configured for communication using contactless coupling.

FIG. 2, comprised of FIGS. 2A and 2B, includes a block diagrams showing example electrical terminations of the conductive traces shown in FIG. 1.

Like reference numerals in different figures indicate like elements.

DETAILED DESCRIPTION

Figure 3:
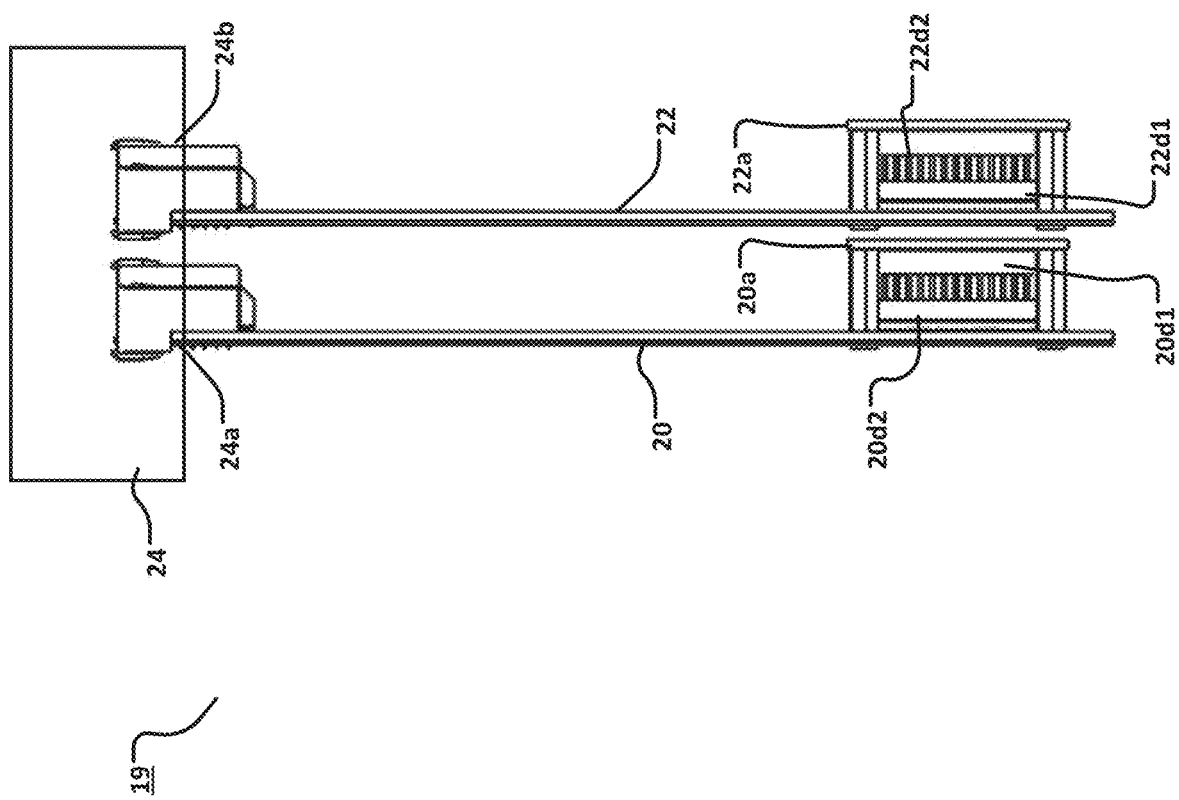
FIG. 3 is a side view of two example circuit boards having conductive traces and companion boards configured for communication using contactless coupling.

The example systems described herein use the spatial alignment and separation of devices, such as circuit boards (or "cards") in a backplane, to enable contactless coupling of signal traces from a first device to signal traces of a second device. The systems also includes circuitry that converts coupled energy from transmitting signal traces to receiving signal traces into a digital signal logically correlated to the digital signal transmitted on the transmitting signal traces. Since information may be transferred from the transmitting signal traces directly to the receiving signal traces with very little delay in some implementations. The resulting communication may have performance characteristics similar to those of a cabled connection.

An example system of the foregoing type includes a first circuit board having first conductive traces, where a first conductive trace is for conducting an alternating current (AC) digital signal having an edge; and a second circuit board having second conductive traces, where a second conductive trace is within a predefined distance of the first conductive trace to produce a contactless coupling with the first conductive trace. The first and second circuit boards, and thus the first and second conductive traces, are physically separated from each other by an air gap. Contactless coupling over the air gap enables electrical energy on the first conductive trace to manifest on the second conductive trace as a transient response that is based on the edge. Circuitry associated with the second circuit board is configured to reconstruct the edge based on the transient response on or from the second conductive trace.

FIG. 1 shows a first circuit board 10 and a second circuit board 12 in an example system 5 of the foregoing type. First circuit board 10 includes one or more first conductive trace including 10a, and second circuit board 12 includes one or more second conductive traces including 12a. The conductive traces may be made of copper or any other appropriately conductive material. The first and second conductive traces are configured—for example, sized, spaced, and/or shaped—to carry data signals, such as, but not limited to, data signals in the megahertz (MHz) range to gigahertz (GHz range). For example, the data signals may be AC digital signals having frequencies in the range of, or exceeding, 50 Mz, 100 Mz, 125 MHz, 1 GHz, 5 GHz, 10 GHz, or/to 20 GHz. Each circuit board also includes respective electrical conductors 10d and 12d, which are reference planes, for example, connected to an electrical reference voltage such as ground, that enable controlled impedance and provide shielding from adjacent slots.

The first conductive traces may be terminated to reduce at least one of electromagnetic interference or electromagnetic emissions and/or to maintain AC digital signal fidelity. The second conductive traces may be terminated reduce at least one of electromagnetic interference or electromagnetic emissions and/or to maintain AC digital signal fidelity. For example, referring to FIG. 2A, first conductive trace 10a carries a data signal from the first circuit board. First conductive trace 10a is terminated using a capacitive-resistive circuit 10b connected to electrical ground. The second conductive trace 12a is on the second circuit board, and is aligned to the first conductive trace on the first circuit board, as shown in FIG. 1. Second conductive trace 12a is terminated using a capacitive-resistive circuit 12b connected to electrical ground. The two circuit boards 10, 12, and thus their respective conductive traces are physically separated from each other by an air gap 14, with the only possibly physical connection being through backplane 15 in this example. Air gap 14 between the two circuit boards 10, 12 allows each of the individual circuit boards to slide into and out of a backplane 15 (FIG. 1) without damaging the other circuit board. Termination methods other than those described herein may be used to terminate the conductive traces. Backplane 15, in this example, provides power and allows communication between a control system and the circuit boards plugged-into/connected to the backplane.

FIG. 2B shows how one of the conductive traces, here trace 10a, is driven by a transmitter circuit 10e and the other conductive trace, here 12a, has circuitry 12d to receive the coupled transient response. Notably, the transmitter circuit 10e and circuitry 12d may be implemented using the same or different types of transistor logic. Examples of logic that may be used include, but not limited to, emitter-coupled logic (ECL) and low-voltage differential signaling (LVDS) logic. A non-standardized logic family that is established by a designer may be used for the given application.

In this regard, FIG. 2B shows only a single lane being coupled. ECL and LVDS are differential logic families. In order to couple differential logic families, additional instances of these traces can be used to support a second leg of the differential signal. Differential terminations may have a different termination scheme and the space between these traces should be sufficient to minimize or to reduce energy transfer from a positive leg to a negative leg of the differential signal. In an example system, about three times the width of the trace may be used to provide that isolation.

Referring back to FIG. 1, the first and second circuit boards 10, 12 are plugged into respective slots 15a and 15b of a backplane 15 so that the first and second conductive trace 10a, 12a are within a predefined distance 18 of each other. For example, the first and second conductive traces may be within 1.5 millimeters (mm) to 3.5 mm of each other to enable the contactless coupling and communication described herein. The predefined distance 18 is variable, and may depend on factors such as a sensitivity of a receiver in a circuit board or the backplane (e.g., how small of a signal a receiving circuitry can differentiate from noise), a width of the first conductive trace, a width of the second conductive trace, an electrical energy level of the data signal, and spacing between traces on the first and second circuit boards. For example, wider conductive traces and/or greater spacing between conductive traces on the two circuit boards may enable distances of greater than 2.5 mm, e.g., 3 mm, 3.5 mm, 4 mm, or more. Likewise, more narrow conductive traces and/or traces that are closer together on the two circuit boards may require distances less than 1.5 mm, e.g., 1 mm or 0.5 mm. Other distances than those described herein may be used depending upon the geometry of the traces and the types of signals transmitted by the traces. Although only two circuit boards are shown in FIG. 1, more than two may be plugged into the backplane.

When the conductive traces on first circuit board 10 and second circuit board 12 are close enough to each other—for example, within the predefined distance—the two circuit boards can communicate directly with each other. That is, signals need not pass through backplane 15 but rather electrical energy passes directly from conductive trace 10a to conductive trace 12a, or vice versa, over air gap 14, enabling communications with little or no delay. For example, as described below, first conductive trace 10a may conduct an AC digital signal having an edge—in this example, the AC signal may be rectangular. The contactless coupling between conductive traces 10a and 12a enables the electrical energy on conductive trace 10a—for example, the AC digital signal—to cause a transient response on conductive trace 12a. In some examples, this transient response may be a signal pulse ("pulse") that appears on conductive trace 12a. This transient response is based on the AC digital signal. For example, the transient response may be based on the AC digital signal edge, as described below. Circuitry, which is also described below, is configured to reconstruct the original AC digital signal on circuit board 12 using the transient response that appears on conductive trace 12a.

The system described herein can be configured to enable communication from trace 10a to 12a and/or from trace 12a to trace 10a.

Figure 14:
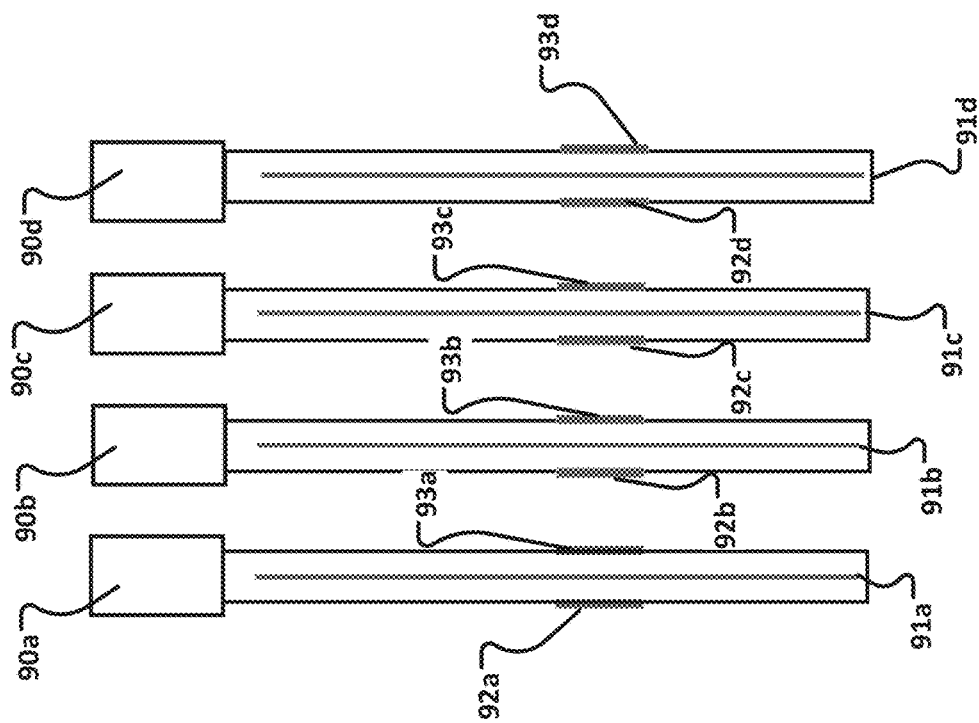
FIG. 14 is a side view of four example circuit boards, each having two conductive traces configured for communication using contactless coupling.

An implementation based on the configuration of FIG. 1 can be used to contactlessly couple adjacent circuit boards in backplanes or other structures having move than two slots. Referring to FIG. 14, for slots 90a to 90d, respective reference planes are labeled 91a to 91d and conductive traces for coupling are labeled 92a to 92d and 93a to 93d. For example, conductive trace 93a may contactlessly couple to conductive trace 92b; conductive traces 93b may contactlessly couple to conductive trace 92c, and so forth. There may also be more than one contactlessly-couplable conductive trace per board, as shown in the example implementation of FIG. 15.

Figure 15:
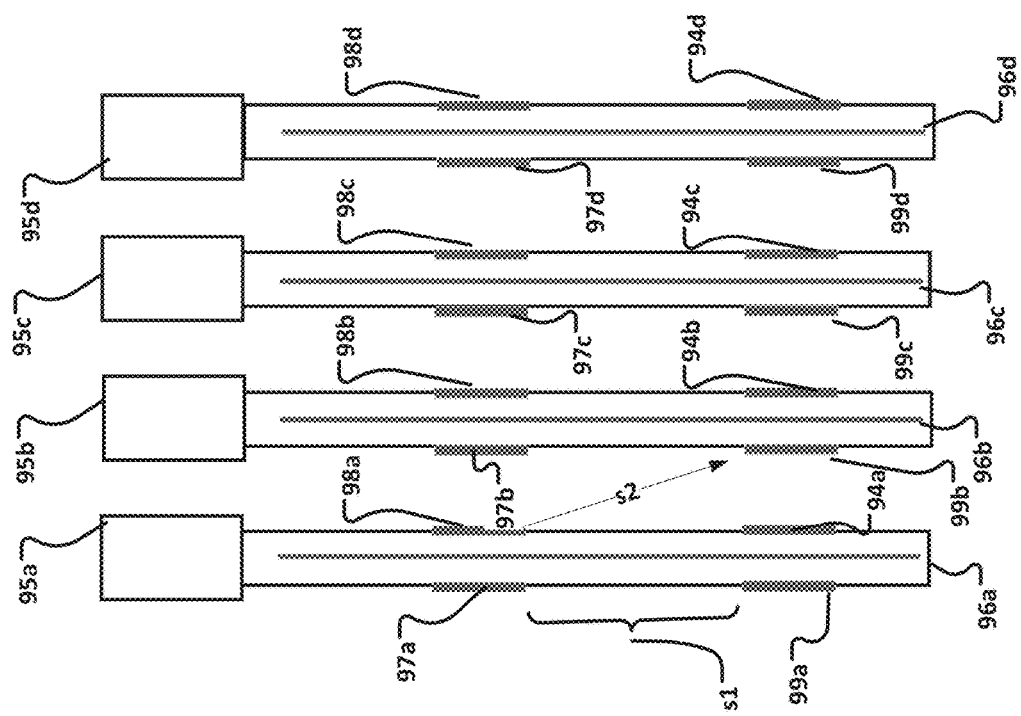
FIG. 15 is a side view of four example circuit boards, each having four conductive traces configured for communication using contactless coupling.

In the implementation of FIG. 15, each circuit board includes two contactlessly-couplable conductive traces. In some implementations, circuit boards may include more than two contactlessly-couplable conductive traces (not shown). In the example of FIG. 14, for slots 95a to 95d of a backplane or other structure, respective reference planes are labeled 96a to 96d and conductive traces for contactlessly coupling are labeled 97a to 97d, 98a to 98d, 99a to 99d, and 94a to 94d. In implementations where there are more than one coupling trace per circuit board as shown in FIG. 15, sufficient space s1 is included between adjacent conductive traces on the same circuit board to ensure reduced or minimal energy is coupled to non-adjacent traces, for example, to limit or to prevent contactless coupling of the type described herein between conductive trace 98a and conductive trace 99b along the direction of line S2. In FIG. 15, the two traces may be independent or two parts to a differential signal line.

Figure 4:
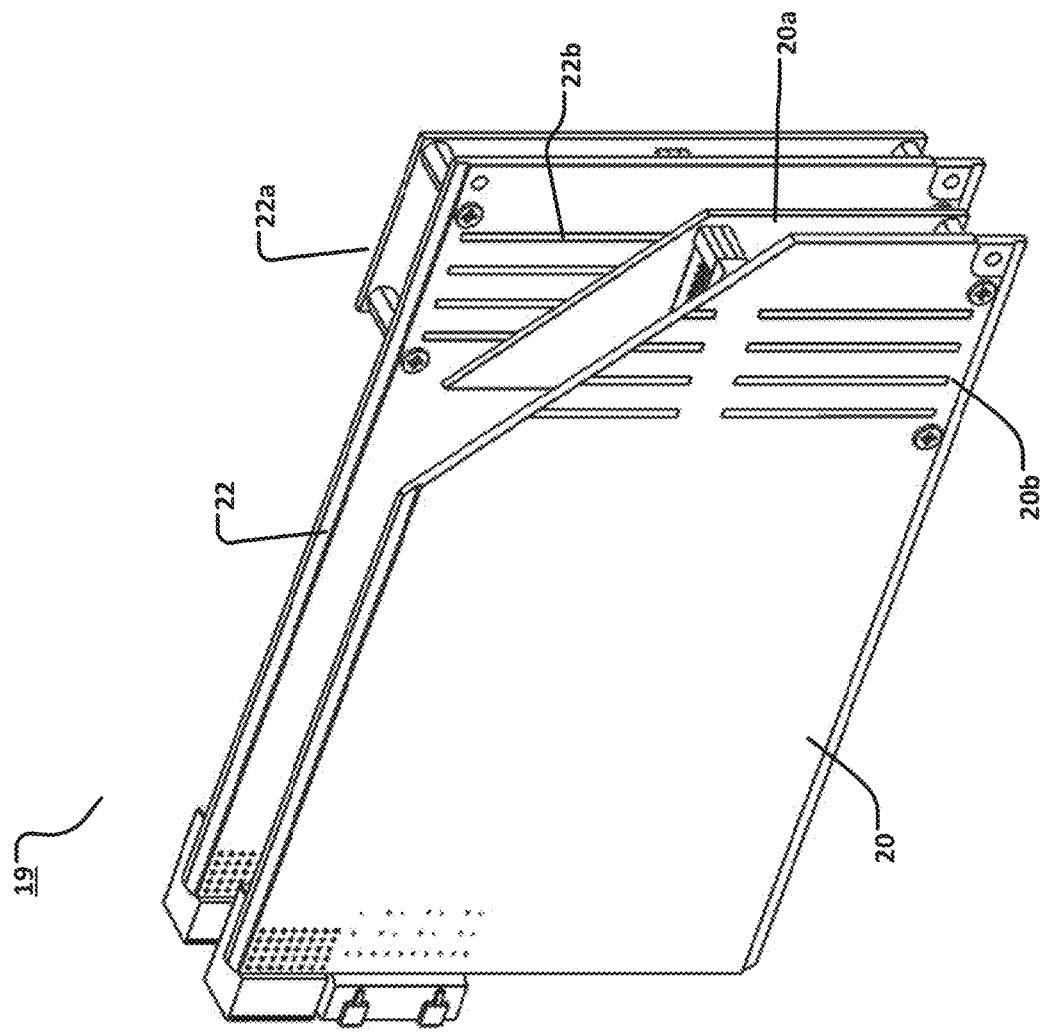
FIG. 4 is a back perspective view of the circuit boards of FIG. 3 having a part of the circuit board and companion board in the foreground partially cut away to see behind them.
Figure 5:
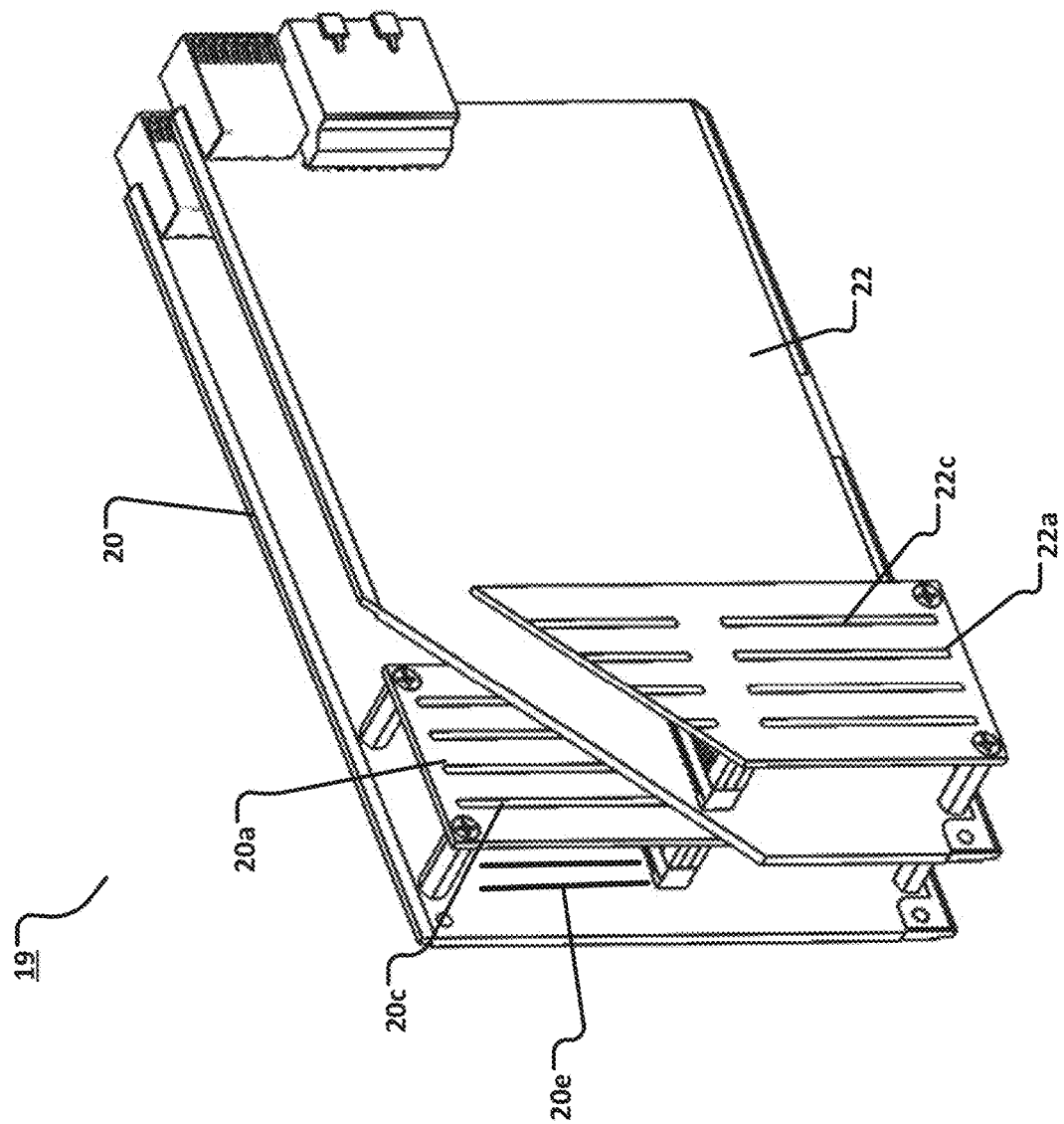
FIG. 5 is a front perspective view of the circuit boards of FIG. 3 having a part of the circuit board and companion board in the foreground partially cut away to see behind them.

FIG. 3 shows a first circuit board 20 and a second circuit board 22 in another example system 19 that enables communication between circuit boards using contactless coupling. This implementation differs from system 5 of FIG. 1 in that the first and second circuit boards—in this example, referred to as the first and second main boards, respectively—each includes a companion board. That is, first main board 20 includes a first companion board 20a and second main board 22 includes a second companion board 22a. The companion boards are configured to bring conductive traces that carry signals from the main boards within an appropriate predefined distance (e.g., 1.5 mm to 2.5 mm) of conductive traces on an adjacent main board. FIGS. 4 and 5 show, respectively, partially cut-away back and front perspective views of the main boards and companion board shown in FIG. 3, without backplane 24 shown in FIG. 3.

Referring to FIG. 4, first main board 20 includes first conductive traces 20b. Second main board 22 includes second conductive traces 22b. The configurations and placements of the conductive traces on the main board are examples only; the conductive traces may be at different locations, in different numbers, and in different configurations. The conductive traces on both main boards may be terminated in the manner described with respect to FIG. 2A. In this example implementation, the slots 24a and 24b of the backplane 24 (FIG. 3) are not close enough together to enable contactless coupling that allows the first main board to communicate directly with the second main board as described with respect to FIG. 1. Accordingly, as shown in FIGS. 3 to 5 companion boards 20a and 22a are offset relative to the surfaces of main boards 20 and 22, respectively, to enable communication using contactless coupling. In this regard, as shown in FIG. 5, the companion boards also include conductive traces 20c and 22c that connect electrically to the conductive traces on their respective main boards so that signals from the main board conductive traces pass to and through the companion board conductive traces. Conductive traces on the companion boards may be arranged in a same pattern and at same spacings as the conductive traces that they are intended to communicate with on the main boards. For example, conductive traces 20c on companion board 20a (FIG. 5) may be arranged in a same pattern and at same spacings as conductive traces 22b on second main board 22 (FIG. 4). Such an arrangement facilitates alignment between the conductive traces on the companion board and the conductive traces on the main board to enable contactless coupling.

In the example of FIG. 3, signals pass through wires or vias in or through vertical connectors 20d1, 20d2 and 22d1, 22d2. In an example, vertical connectors 20d1, 20d2 and 22d1, 22d2 may be dielectric structures having wires, vias, or other types of conductive traces embedded therein to connect the conductive traces on a main board to the conductive traces on the corresponding companion board.

Taking first main board 20 and its companion board 20a as an example, vertical connectors 20d1, 20d2 are configured—for example, are dimensioned and/or arranged—so that the conductive traces 20c on companion board 20a (FIG. 5) are within the predefined distance (e.g., 1.5 mm to 2.5 mm) of conductive traces 22b on second main board 22 (FIG. 4) and contactlessly couple to conducive traces 22b. This distance enables the contactless coupling described between conductive traces on companion board 20a and second main board 22. More specifically, data signals—for example, AC digital signals—from the conductive traces (e.g., 20e, FIG. 5) on first main board 20 pass through vertical connector 20d1 and/or 20d2 to conductive traces 20c on companion board 20a. Those data signals produce transient responses—for example, pulses—on the conductive traces 22b (FIG. 4) on second main board 22 that are based on edges included in those data signals, as explained below. The connectors are chosen to ensure the appropriate distance. Flexible cables may be used in conjunction with stand-off connectors as an alternate option to produce a desired distance for contactless coupling between circuit boards.

In this regard, although we describe companion boards as being connected to the main boards, communications using contactless coupling may be from an adjacent main board to a companion board. That is, the main board may contain the data signal that produces a transient response on the companion board. The transient responses on the companion board is then transmitted to its connected main board for processing, for example, to reconstruct the data signal on the adjacent main board.

Figure 6:
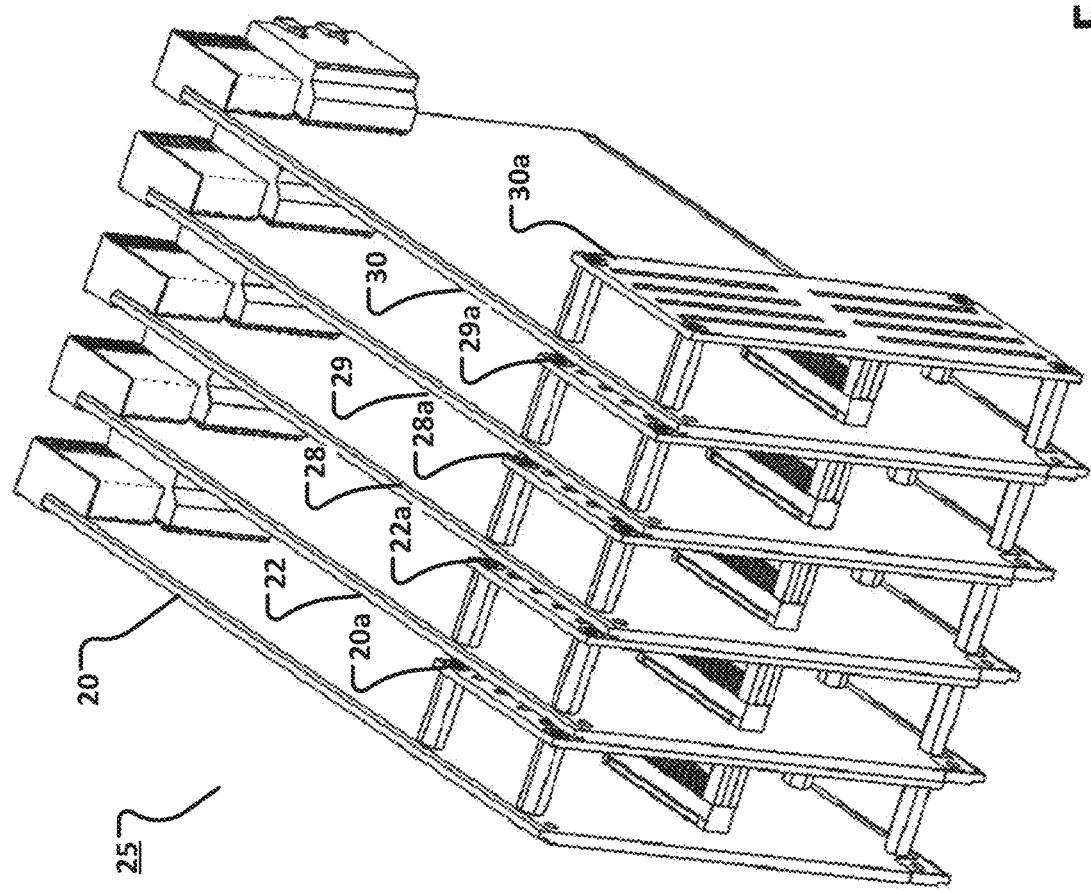
FIG. 6 is a side perspective view of five example circuit boards having conductive traces and companion boards configured for communication using contactless coupling.

FIG. 6 shows an example system 24, which is a variant of system 19 (FIG. 5), and which includes five circuit boards 20, 22, and 28 to 30, each of which is configured for contactless coupling with its neighboring circuit board. In this example, each circuit board includes a companion board 20a, 22a, and 28a to 30a of the type described with respect to FIGS. 3 to 5. In this example, the leftmost circuit board 20a only communicates to circuit board 22 on its right using contactless coupling. In this example, the rightmost circuit board 30 only communicates with the circuit board 29 on its left using contactless coupling. Each of the middle three circuit boards 22, 28, and 29 may communicate with both the circuit board on its left and the circuit board on its right using contactless coupling. Software, which is described below, recognizes the system configuration to control the hardware to enable communication.

In some implementations, there may be more than five circuit boards having companion boards as in FIG. 6 or fewer than five circuit boards of this type plugged into a backplane. In some implementations (not shown), five circuit boards not having companion boards may be plugged into a backplane and configured for contactless coupling with their neighboring circuit boards. For example, the circuit boards may be close enough to their neighbors to enable contactless coupling without the companion boards. In some implementations, there may be more than five circuit boards of this type (i.e., no companion board) or fewer than five circuit boards of this type plugged into a backplane. In some implementations, the circuit boards described herein may implement communication using contactless coupling without a backplane connection or without any other type of common connection. In some implementations, the devices that use contactless coupling for communication are not circuit boards, but rather may be electronic devices having conductive traces contained therein.

Figure 7:
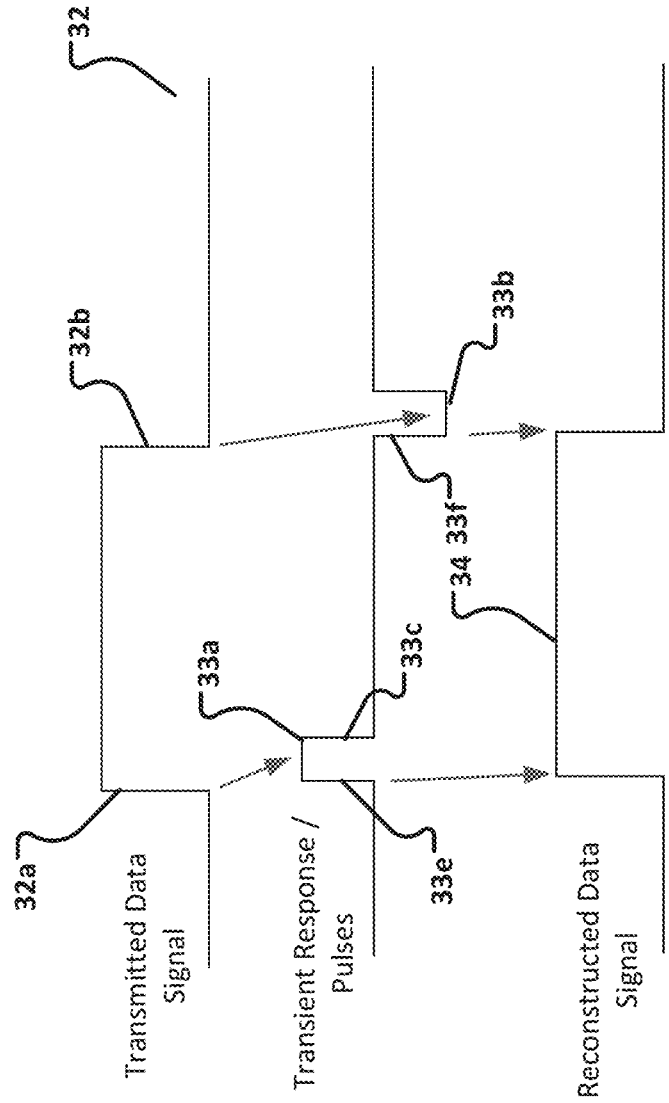
FIG. 7 is a signal diagram showing examples of a transmitted data signal, transient responses thereto, and a reconstructed version of the transmitted data signal.

FIG. 7 shows example signal used and produced via the contactless coupling described herein. Specifically, FIG. 7 shows a transmitted data signal 32, which may be, e.g., a signal carried on a conductive trace 20c of companion board 20a of FIGS. 3 to 5. In this example, data signal 32 is a rectangular AC digital signal, although other types of signals such as square wave signals, trapezoidal wave signals, or triangular wave signals may be used. The rising edge 32a of data signal 32 causes a first transient response 33a to appear in a conductive trace on, e.g., a conductive trace 22b on second main board 22 that is within the predefined distance (e.g., 1.5 mm to 2.5 mm) of conductive trace 20c on companion board 20a carrying the rectangular, square, trapezoidal, or triangular wave signal. In this example, the first transient response 33a is a positive pulse that appears on conductive trace 22b. As shown, the positive pulse has a period that is less than the period of data signal 32. The falling edge 32b of data signal 32 causes a second transient response 33b to appear on the same conductive trace 22b as the positive pulse but at a later time. In this example, the second transient response is a negative pulse that appears on conductive trace 22b. As shown, the negative pulse has a period that is less than the period of data signal 32. Circuitry, which may be resident on any and all of the circuit boards, including the circuit board 22 in this example, and which may be controlled by software running on hardware on the backplane, uses the positive pulse and the negative pulse to reconstruct the data signal 32 and the edges thereof on the second circuit board 22. That reconstructed data signal 34 may be used or processed as desired on the second circuit board. The way that the data signal is reconstructed is described as follows. The reconstructed waveform has high and low levels that can be interpreted as logic high and logic low to match the intended data transmitted.

Figure 8:
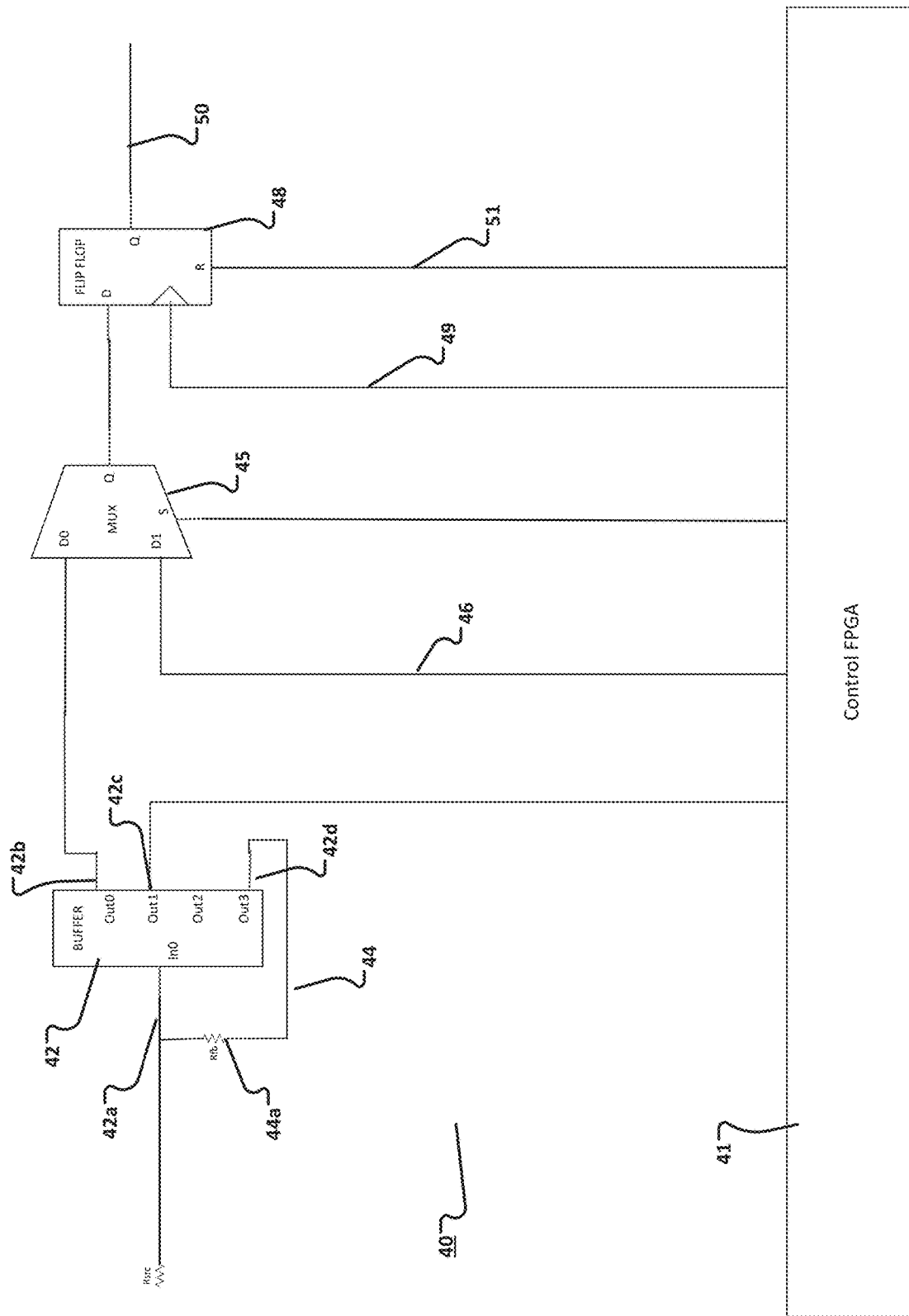
FIG. 8 is block diagram of example circuitry used to reconstruct a transmitted data signal using transient responses obtained through contactless coupling.

FIG. 8 shows an example of the circuitry 40 described in the preceding paragraph to reconstruct the data signal and hardware, such as a control field programmable gate array (FGPA) 41, to execute software to control the remainder of circuitry 40. The software may recognize the configuration of a system such as systems 5, 19, or 25 by reading data from, or detecting, circuit boards plugged into the backplane and only enable contactless communication through control of the circuitry described herein where there are adjacent cards capable of such communication. For example, the software may be programmed to know the which cards are adjacent in the backplane. The software may be programmed to know which circuit boards can communicate with adjacent circuit boards using contactless coupling.

In the following description, the conducive trace that carries a data signal, such as data signal 32 of FIG. 7, is referred to as the transmitting trace. The conductive trace on which the transient responses, such as transient responses/pulses 33a, 33b of FIG. 7, are formed or manifested is referred to as the receiving trace. All boards in the system can transmit or receive depending on how circuitry is connected to the coupling traces. On each board there may be receiving circuitry that reconstructs a signal from a transmitter on an adjacent board and transmitting circuitry that passes on information to the next adjacent board. The same board may have transmitting traces and receiving traces depending on which direction the board is communicating.

In this example, an instance of circuitry 40 (or circuitry 55, 65, 80 described below or equivalents thereof) may be on more than one, or each of the, circuit boards connected to the backplane. Circuitry 40 includes a buffer 42 having an input 42a and multiple outputs 42b, 42c, 42d. In some implementations, buffer 42 is a fanout buffer. A fanout buffer is configured to create multiple copies of an input signal at its outputs and to distribute the copies among several loads while achieving relatively fast rise/fall time and relatively low jitter. Circuitry 40 includes receive circuitry (42) and transmitting circuitry (48). The signal on input 42a comes in from the receiving coupling trace and the signal on output 50 goes to the next transmitting coupling trace Input 42a is configured to receive the transient response, or pulses, from a transmitting conductive trace. Buffer 42 is configured to hold its outputs 42b, 42c, 42d at a logic high level in response to a positive pulse (transient response) and to change its outputs 42b, 42c, 42d to a logic low level in response to a negative pulse (transient response). To this end, buffer 42 includes, or is connected to, a feedback circuit 44 from output 42d of the buffer to input 42a of the buffer. A logic high level applied to the input 42a of buffer 42 from feedback circuit 44 maintains outputs 42b, 42c, 42d at the logic high level until a negative pulse is received at the input 42a. In this regard, the logic high level corresponds to the voltage at which a logic "1" registers and a logic low level corresponds to the voltage at which a logic "0" registers. To this end, feedback circuit 44 includes one or more resistors 44a that are configured—for example, sized and arranged—to provide resistance that sets a threshold for changing the logic levels at the outputs 42b, 42c, 42d of the buffer.

In a particular non-limiting example, buffer 42 has a 200 picosecond (ps) propagation delay and the pulses in the transient response have a width of about 300 ps to 400 ps. Thus, the buffer has a propagation delay that is less than a width of a positive pulse. Some time is allowed for the propagation of the signal through the conductive trace 44. The rising edge of a positive pulse 33a (FIG. 7) causes buffer outputs 42b, 42c, 42d to be at a logic high level. That logic high level reaches input 42a via feedback circuit 44 before the falling edge of the positive pulse causes the buffer outputs to change to a logic low level. That is, the logic high level held at input 42a via feedback circuit 44 prevents the falling edge of the positive pulse (33c in FIG. 7) from changing the state of the buffer outputs 42b, 42c, 42d to the logic low level. That is, the combination of the two do not produce a sufficiently low voltage signal at input 42a to cause a change in state of the buffer outputs 42b, 42c, 42d to the logic low level. Only the negative pulse 33b (FIG. 7), which sufficiently counteracts the effect of the logic high level from feedback circuit 44, will produce a signal that is sufficiently negative to change the state of the buffer outputs 42b, 42c, 42d from the logic high level to the logic low level.

Accordingly, by using buffer 42 and feedback circuit 44, the original data signal can be produced at buffer outputs 42b, 42c, 42d. That is, as shown in FIG. 7, the timing of the rising edge 33e of the positive pulse 33a corresponds to the timing of the rising edge 32a of the data signal 32 This rising edge 33e causes the outputs 42b, 42c, 42d of buffer 42 to output a logic high level. This logic high level is maintained, via feedback circuit 44, until the negative pulse 33b is received at input 42a. As shown in FIG. 7, the timing of falling edge 33f of negative pulse 33b corresponds to the timing of the falling edge 32b of the data signal 32. This falling edge 33f causes the outputs 42b, 42c, 42d of buffer 42 to change to a logic low level. The resulting reconstructed signal 34 at the outputs 42b, 42c, 42d of buffer 42 has the same period and timing as the original data signal 32. Voltages corresponding to the logic levels of the reconstructed data signal 34 may be the same as the voltage corresponding to the logic levels of the original data signal or the voltages corresponding to the logic levels of the reconstructed data signal may be amplified if necessary to reach those voltages.

Referring back to FIG. 8, circuitry 40 also includes a multiplexer 45 to receive the reconstructed data signal from buffer 42. Control FPGA 41 is configured to select, for output, either the reconstructed data signal from buffer 42 or a signal 46 provided by the control FPGA that is independent of, or based on, the reconstructed data signal (since output 42c of buffer 42 also provides the reconstructed data signal to the control FPGA).

Circuitry 40 also includes a flip-flop circuit 48 to receive an output of multiplexer 45, e.g., either the reconstructed data signal or the signal from the control FGPA. The control FPGA 41 is configured to control the timing of flip-flop circuit 48 using data clock 49 in order to provide the output 50 of multiplexer 48 to another, adjacent circuit board at a predefined timing. A clear signal 51 resets the flip-flop circuit. The output 50 of multiplexer 48 may be provided to another circuit board either using contactless coupling as described herein or the output 50 of multiplexer 48 may be provided to data bus(es) or other conductive traces on the circuit boards and the backplane.

Thus, circuitry 40 may be used as part of a method that includes producing a first transient response corresponding to a rising edge of a digital signal, where the digital signal conducts through a first conductive trace on a first circuit board and the first transient response is produced on a second conductive trace on a second circuit board, and where the first conductive trace and the second conductive trace is in a contactless coupling that is based on proximity of the first conductive trace and the second conductive trace. The contactless coupling enables the second conductive trace to produce the first transient response. The method also includes producing a second transient response corresponding to the falling edge of the digital signal. The second transient response is produced on the second conductive trace based on the contactless coupling. The circuitry generates a logic high level in response to the first transient response, and generates a logic low level in response to the second transient response, thereby reconstructing at least part of the digital signal.

Figure 9:
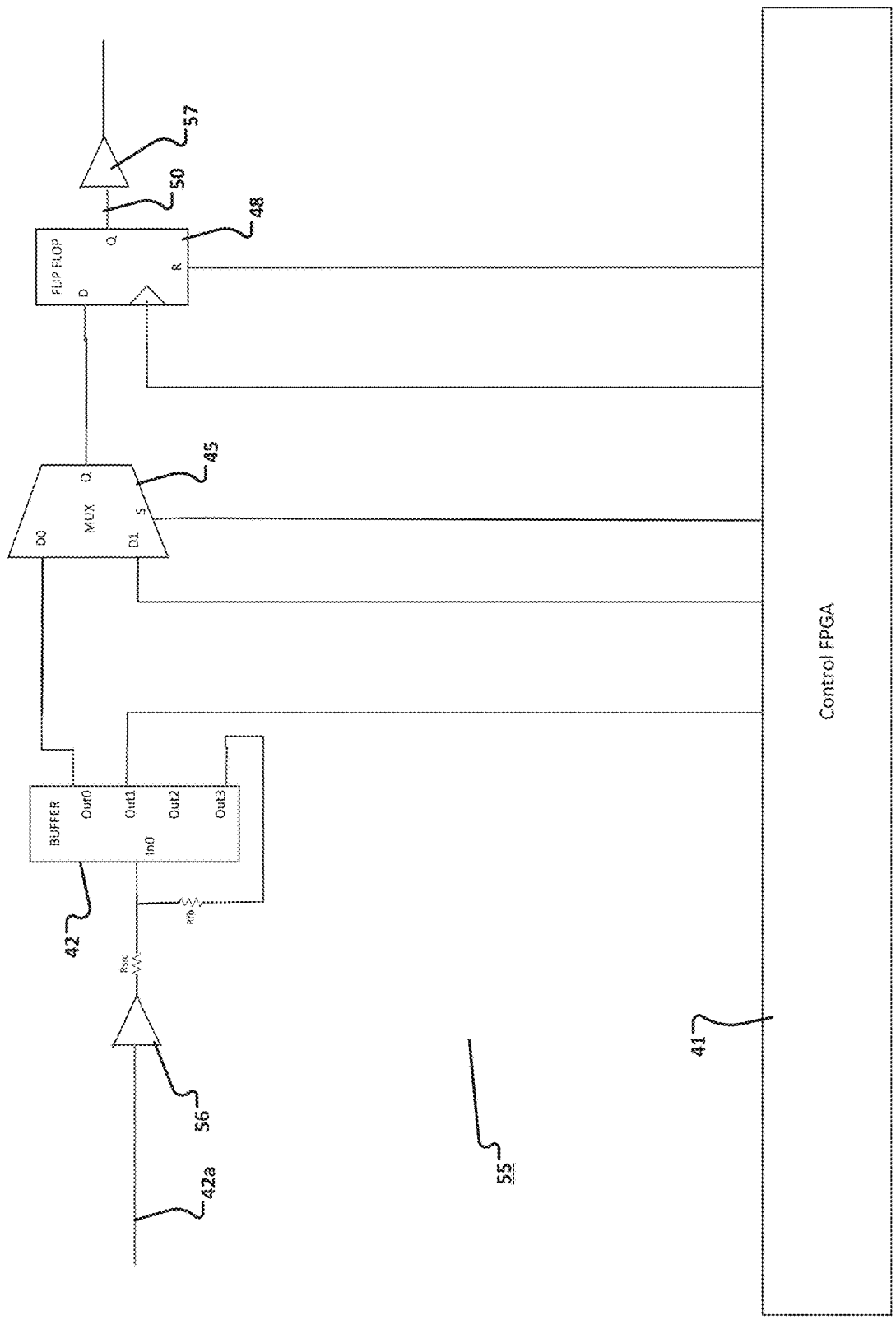
FIG. 9 is block diagram of a variation on the example circuitry of FIG. 8 used to reconstruct a transmitted data signal using transient responses obtained through contactless coupling.

Referring to FIG. 9, circuitry 55, which is a variant of circuitry 40, includes amplifiers 56 and 57 at its input 42 and output 50, respectively. Amplifier 56 is configured to increase a signal level of received transient responses prior to circuitry 55 reconstructing the original data signal. Amplifier 57 is configured to increase a signal level of at least part of the data signal before output.

The implementations described with respect to FIGS. 7 to 9 show single-ended signaling, in which a single conductor is driven with a signal. However, the techniques described herein may also be used with differential signaling. Differential signaling includes techniques for transmitting data using two complementary signals. The techniques send the same electrical signal as a differential pair of signals, each in its own conductor. The pair of conductors can be wires in a twisted-pair or ribbon cable or conductive traces on a circuit board. Electrically, the two conductors carry voltage signals that are equal in magnitude, but that are opposite in polarity. In a differential signal, the two signals are 180° out of phase with each other. A circuit that receives the differential signal responds to the difference between the two signals, which may result in a signal having a magnitude twice as large. Each of the conductive traces carrying the differential signals may be terminated using resistive-capacitive circuitry in order to reduce at least one of electromagnetic interference or electromagnetic emissions and/or to maintain AC digital signal fidelity.

Figure 10:
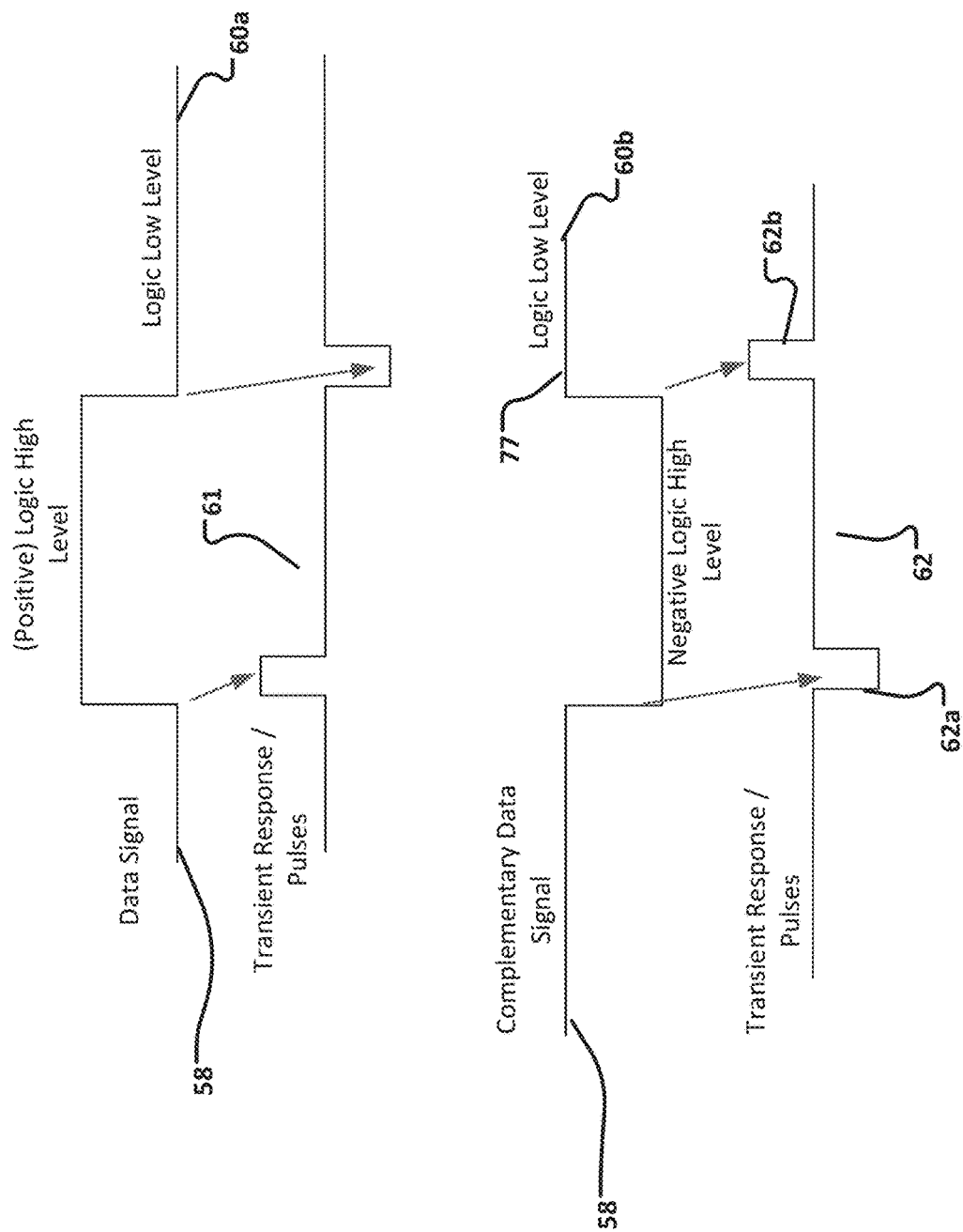
FIG. 10 is a signal diagram showing an example of a differential signal and transient responses produced by its constituent signals.

The contactless coupling communication techniques described herein operate the same using differential signals as they do using single-ended signals. For example, referring to FIG. 10, one of the complementary signals 60a of differential signal 58 produces transient responses 61 on a first adjacent conductive trace that are identical to those produced in by single-ended signal 32 described with respect to FIG. 7. The other of the complementary signals 60b of differential signal 58 produces transient responses 62 on a second, different adjacent conductive trace that are complementary to, and that have the same timings as, the transient responses produced by signal 60a. For example the falling edge of signal 60b produces a negative pulse 62a and the rising edge of signal 60b produces a positive pulse 62b. In FIG. 10, negative logic high level is a negative of the positive logic high level voltage needed to produce a logic "1,". The transient responses may be used to reconstruct the differential signal as described herein.

Figure 11:
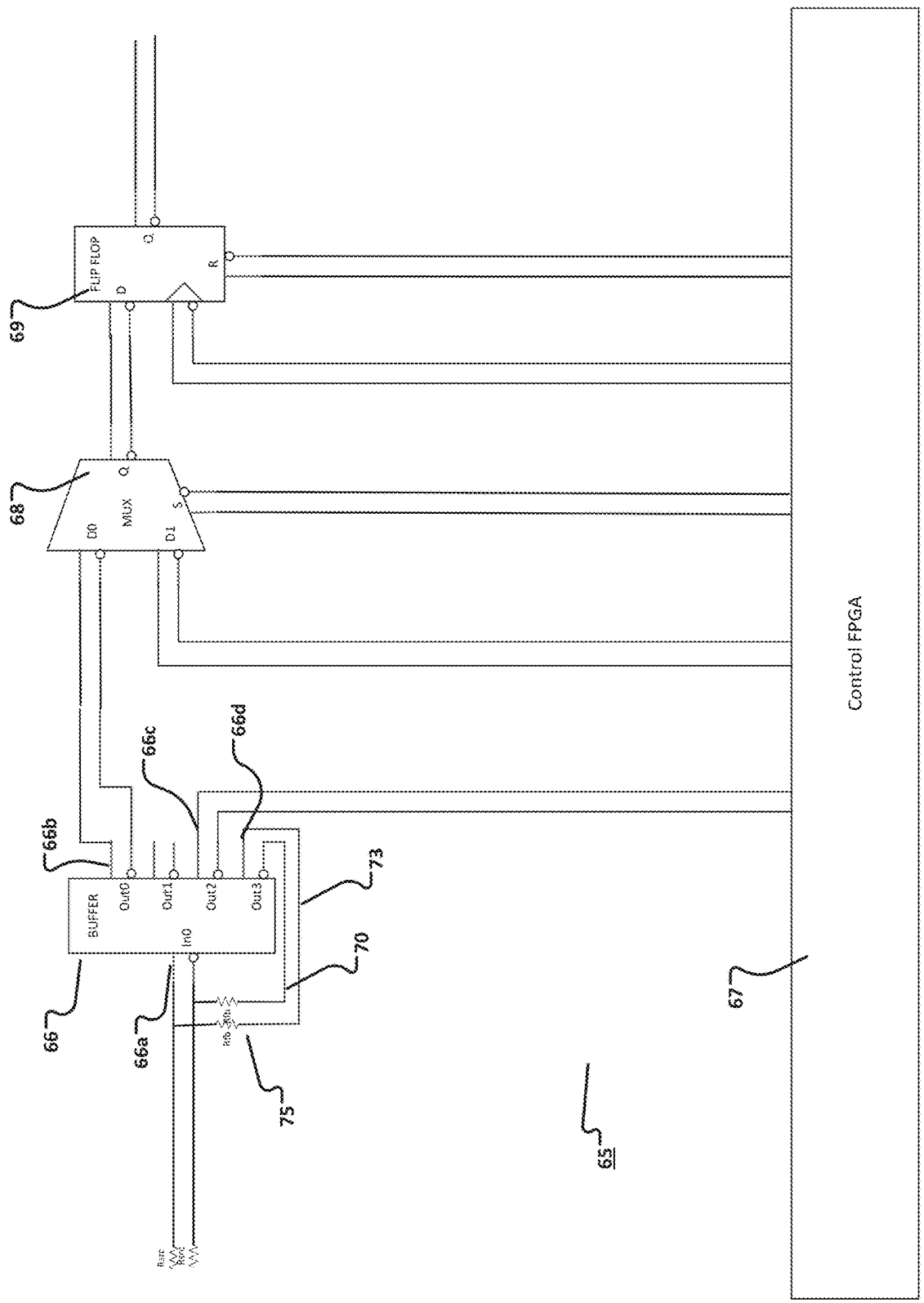
FIG. 11 is block diagram of example circuitry used to reconstruct a transmitted differential data signal using transient responses obtained through contactless coupling.

Referring to FIG. 11, circuitry 65, which is a variant of circuitry 40 of FIG. 8, includes the same circuit elements as those of FIG. 8, but configured to process differential signals. These circuit elements include buffer 66, control FPGA 67, multiplexer 68, and flip-flop circuit 69. These circuit elements operate in the same manner as described with respect to FIG. 8, only using differential signals. Accordingly, their operation will not be repeated here, except for the operation of buffer 66. Together these signals create a differential signal with a positive pulse during rising edges of the non-inverting signal and a differential signal with a negative pulse during falling edges of the non-inverting signal.

In this regard, for a signal in an input differential signal like signal 60a shown in FIG. 10, buffer 66 and its corresponding feedback circuit 70 operate in the manner as buffer 42 and feedback circuit 44 described with respect to FIG. 8 above. For the complementary signal 60b of the differential signal (FIG. 10), buffer 66 is configured to operate in a manner is similar, but in a manner that latches input 66a a negative logic high level until a positive pulse 62b of the signal arrives at input 66a.

More specifically, input 66a is configured to receive the transient response, or pulses, from a conductive trace on the same board that carries the complementary signal 60b. Buffer 66 is configured to hold its outputs 66b, 66c, 66d at a negative logic high level in response to a negative pulse (transient response 62a) and to change its outputs 66b, 66c, 66d to a logic low level in response to a positive pulse (transient response 62b). To this end, buffer 66 includes a feedback circuit 73 from the output 66d of the buffer to the input 66a of the buffer. A negative logic high level applied to the input 66a of buffer 66 from feedback circuit 73 maintains outputs 66b, 66c, 66d at the negative logic high level until a positive pulse 62b (FIG. 10) is received at input 66a. As described above, feedback circuit 73 includes one or more resistors 75 that are configured—for example, sized and arranged—to provide resistance that sets a threshold for changing logic levels of the outputs 66b, 66c, 66d of the buffer.

In the same non-limiting example used previously, buffer 66 has a 200 ps propagation delay and the pulses in the transient response have a width of about 300 ps to 400 ps. Thus, buffer has a propagation delay that is less than a width of the negative transient response. The falling edge of a negative pulse 62a (FIG. 10) causes the buffer outputs 66b, 66c, 66d to change to the negative logic high level. That negative logic high level reaches input 66a via the feedback circuit 73 before the rising edge of negative pulse 62a causes the buffer outputs 66b, 66c, 66d to change to logic low level. The negative logic high level latched at input 66a via feedback circuit 73 prevents the rising edge of the negative pulse 62a from changing the state of the buffer outputs 66b, 66c, 66d to the logic low level. That is, the combination of the two do not produce a sufficiently positive signal to cause a change in state of the buffer. Only the positive pulse 62b, which sufficiently counteracts the effect of the negative logic high level from the feedback circuit will produce a signal that is sufficiently positive to change the state of the buffer outputs 66b, 66c, 66d from negative logic high to logic low.

Accordingly, by using the buffer and feedback circuit 73, the original complementary data signal 60b can be produced at buffer outputs 66b, 66c, 66d. That is, as shown in FIG. 10, the timing of the falling edge of the negative pulse 62a corresponds to the timing of the falling edge of the complementary data signal 60b. The falling edge of pulse 62a causes the outputs 66b, 66c, 66d of buffer 66 to change to a negative logic high level. This negative logic high level is maintained, via feedback circuit 73, until the rising edge of the positive pulse 62b is received at input 66a. As shown in FIG. 10, the timing of the rising edge of positive pulse 62b corresponds to the timing of the rising edge of the complementary data signal 60b toward the logic low level 77. This rising edge of pulse 62b causes the outputs 66b, 66c, 66d of buffer 66 to output a logic low level. The resulting reconstructed complementary data signal at outputs 66b, 66c, 66d of the buffer has the same period as data signal 60b and the same timing as data signal 60b. The voltages corresponding to the logic levels of the reconstructed complementary data signal (not shown) may be the same as the voltages corresponding to the logic levels of the original complementary data signal or the voltages corresponding to the logic levels of the reconstructed complementary data signal may be amplified if necessary.

Figure 12:
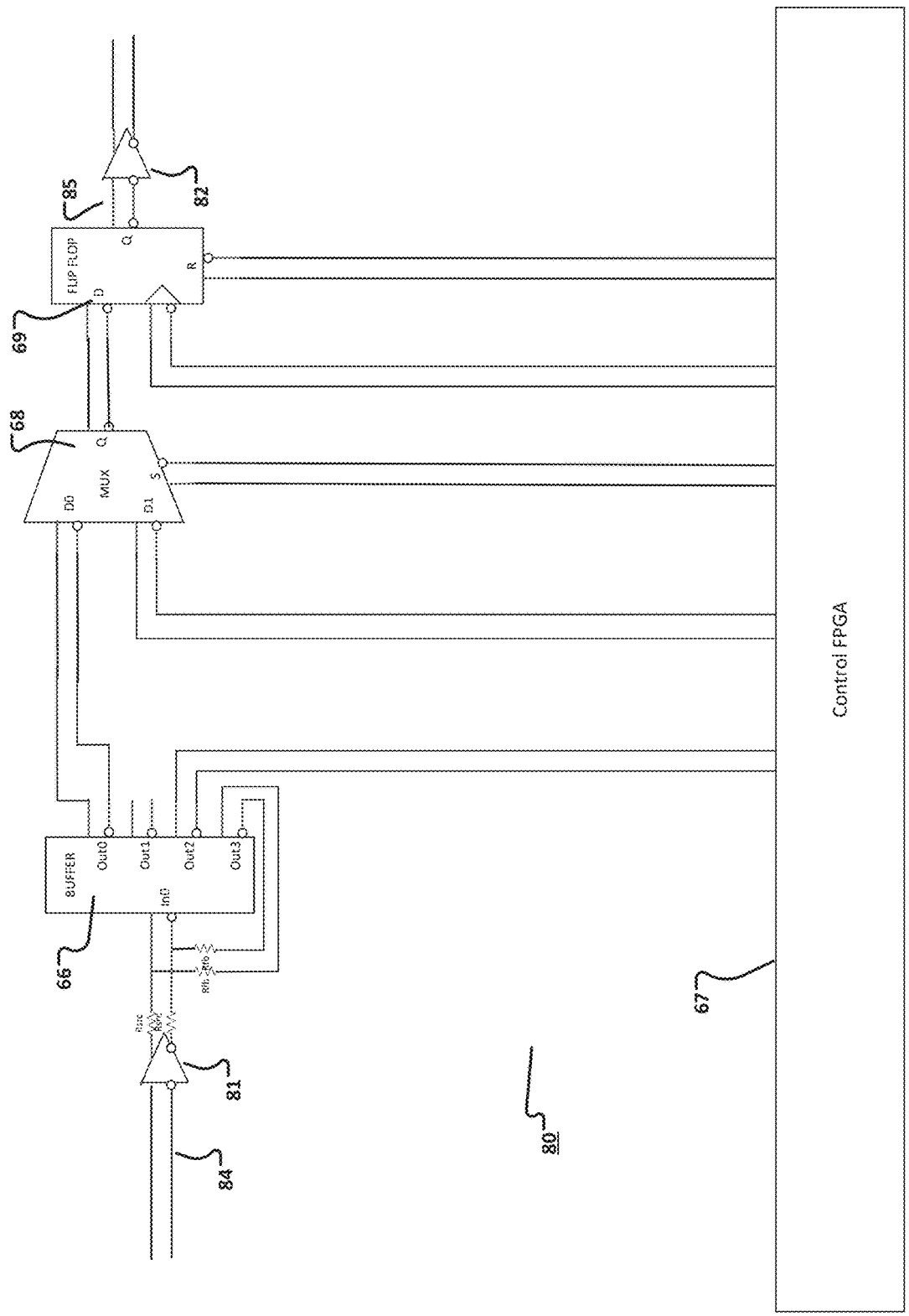
FIG. 12 is block diagram of a variation on the example circuitry of FIG. 11 used to reconstruct a transmitted differential data signal using transient responses obtained through contactless coupling.

Referring to FIG. 12, circuitry 80, which is a variant of circuitry 65, includes amplifiers 81 and 82 at the input 84 and output 85, respectively, of the circuitry. Amplifier 81 is configured to increase a signal level of the transient responses on the incoming differential signal prior to circuitry 80 reconstructing the original differential data signal. Amplifier 82 is configured to increase a signal level of all or part of the reconstructed differential data signal before output.

Figure 13:
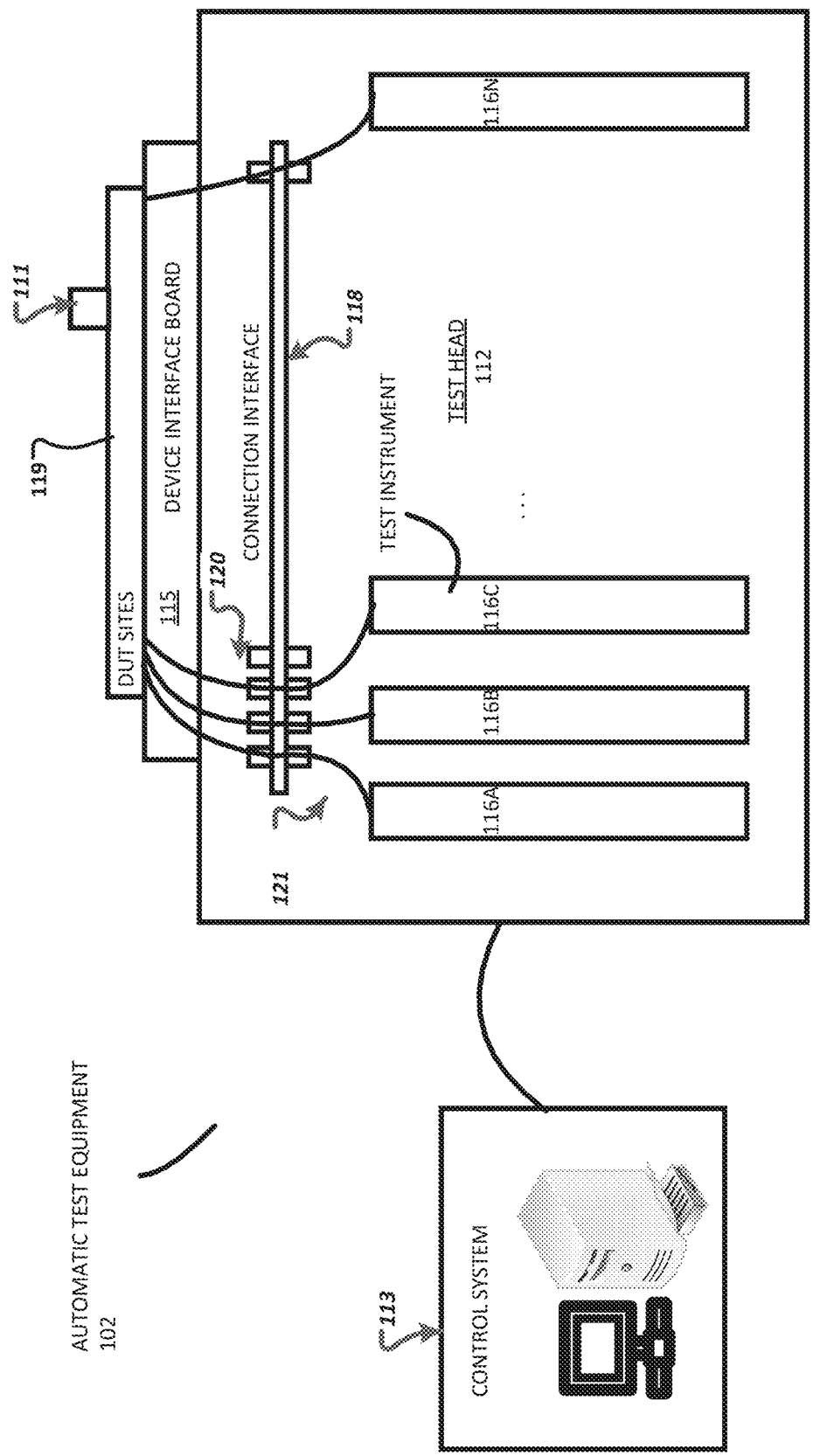
FIG. 13 is a block diagram of example automatic test equipment having test instruments configured to communicate using contactless coupling.

FIG. 13 shows components of example automatic test equipment (ATE) 102 having test instruments implemented using circuit boards of the type described herein plugged into a backplane. For example, the circuit boards may be test instruments of the type described below or otherwise known in the art.

ATE 102 includes a test head 112 and a control system 113. The control system may include a computing system comprised of one or more microprocessors or other appropriate processing devices as described herein. The control FPGA described herein may be, or be part of, control system 113. Device interface board (DIB) 115 includes a circuit board. DIB is connected to test head 112 and includes mechanical and electrical interfaces at sites 119 to one or more DUTs, such as DUT 111, that are being tested or are to be tested by the ATE. Power, including voltage, may be run via one or more layers in the DIB to DUTs connected to the DIB. DIB 115 also may include one or more ground layers and one or signal layers with connected vias for transmitting signals between the DUTs and the test instruments.

Test signals and response signals, such as AC digital signals, and other types of signals pass via test channels to sites 119 between the DUTs and various test instruments over DIB 115. DIB 115 may also include, among other things, connectors, conductive traces, conductive layers, and circuitry for routing signals between the test instruments, DUTs connected to sites 119, and other circuitry.

Control system 113 communicates with components included in the test head to control testing and the circuitry described herein. For example, control system 113 may download test program sets to test instruments 116A to 116N in the test head. In an example, a test program generates a test pattern (or flow) to provide to the DUT. The test pattern is written to output test signals to elicit a response from the DUT, for example. As noted, the test signals and the response from the DUT may include AC digital signals, which may be single-ended or differential as described herein.

The test instruments include hardware devices that may include one or more processing devices and other circuitry. Test instruments 116A to 116N may run the test program sets to test DUTs held on the DIB and in communication with the test instruments via the DIB. Control system 113 may also send, to test instruments in the test head, instructions, test data, and/or other information that is usable by the test instruments to perform appropriate tests on DUTs interfaced to the DIB. In some implementations, this information may be sent via a computer or other type of network or via a direct electrical path. In some implementations, this information may be sent via a local area network (LAN) or a wide area network (WAN).

ATE 102 includes multiple test instruments 116A to 116N, each of which may be configured, as appropriate, to perform one or more of testing and/or other functions. Although only four test instruments are depicted, the system may include any appropriate number of test instruments, including those residing outside of test head 112. Test instrument 116A may be configured to output AC digital signals to test a DUT based, e.g., on data provided by the control system, and to receive AC digital response signals from the DUT. Each test instruments may be implemented using a circuit board that connects to—for example, plugs into—a system backplane. The test instruments thus may be configured to communicate with each other or other circuit boards using contactless coupling in the manner described herein. To this end, circuit boards in each of the test instruments may include circuitry of the type described with respect to FIGS. 8, 9, 11, and 12 to implement communication using contactless coupling.

Signals, including AC digital signals, may be sent to, and received from, the DUT over multiple test channels or other electrically conductive media. In some examples, a test channel may include the physical transmission medium or media over which signals are sent from the test instrument to a DUT and over which signals are received from the DUT. Physical transmission media may include, but are not limited to, electrical conductors alone or in combination with optical conductors, wireless transmission media, or both optical conductors and wireless transmission media. In some examples, a test channel may include a range of frequencies over which signals are transmitted over one or more physical transmission media.

In some examples, ATE 102 includes a connection interface 118 that connects test instrument test channels 121 to DIB 115. Connection interface 118 may include connectors 120 for routing signals between the test instruments and DIB 115. The connection interface may include one or more circuit boards or other substrates on which such connectors are mounted. Conductors that are included in the test channels may be routed through the connection interface and the DIB.

Although the implementations described herein are in the context of testing, communication between devices, such as circuit boards or other devices, using contactless coupling may be used outside of a testing context. For example, communication using contactless coupling may be implemented between any two devices in any type of system. The devices may be plugged into a backplane as described herein or just in proximity to each other and not plugged into a common structure, such as a backplane.

All or part of the test systems and techniques described in this specification and their various modifications may be configured or controlled at least in part by one or more computers using one or more computer programs tangibly embodied in one or more information carriers, such as in one or more non-transitory machine-readable storage media. A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected by a network.

Actions associated with configuring or controlling the test system and processes described herein can be performed by one or more programmable processors executing one or more computer programs to control or to perform all or some of the operations described herein. All or part of the test systems and processes can be configured or controlled by special purpose logic circuitry, such as, an FPGA (field programmable gate array) and/or an ASIC (application-specific integrated circuit) or embedded microprocessor(s) localized to the instrument hardware.

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. A system comprising:
   a first circuit board comprising first conductive traces, a first conductive trace for conducting a digital signal comprising an edge;
   a second circuit board comprising second conductive traces, a second conductive trace of the second conductive traces being within a predefined distance of the first conductive trace to produce a contactless coupling with the first conductive trace, the contactless coupling enabling electrical energy on the first conductive trace to manifest on the second conductive trace as a transient response that is based on the edge; and
   circuitry to reconstruct the edge based on the transient response from the second conductive trace.

2. The system of claim 1, wherein the edge is among edges in the digital signal, the edges comprising a rising edge and a falling edge;
   wherein the transient response is based on the edges; and
   wherein the circuitry is configured to reconstruct the edges based on the transient response on the second conductive trace.

3. The system of claim 1, further comprising:
   a backplane configured to receive the first circuit board and the second circuit board, the second circuit board comprising the circuitry; and
   wherein the electrical energy passes directly from the first conductive trace to the second conductive trace without passing through the backplane.

4. The system of claim 1, wherein the first conductive trace is terminated to reduce at least one of electromagnetic interference or electromagnetic emissions and/or to maintain digital signal fidelity; and
   wherein the second conductive trace is terminated reduce at least one of electromagnetic interference or electromagnetic emissions and/or to maintain digital signal fidelity.

5. The system of claim 2, wherein the first conductive trace is part of a first differential transmission line comprised of the first conductive trace and a third conductive trace; and
   wherein the second conductive trace is part of a second differential transmission line comprised of the second conductive trace and a fourth conductive trace.

6. The system of claim 5, wherein the third conductive trace is for conducting second edges, the second edges comprising a second rising edge and a second falling edge;
   wherein the third conductive trace is within a predefined distance of the fourth conductive trace to produce a second contactless coupling with the fourth conductive trace, the second contactless coupling enabling electrical energy on the third conductive trace to manifest on the fourth conductive trace as a second transient response that is based on the second edges, the second transient response being part of a differential transient response; and
   wherein the circuitry is configured to reconstruct at least part of the digital signal based also on the second transient response.

7. The system of claim 1, wherein the circuitry comprises a receiver to receive the transient response; and
   wherein the predefined distance is based on one or more of: a sensitivity of the receiver, a width of the first conductive trace, a width of the second conductive trace, or an electrical energy level of the digital signal.

8. The system of claim 1, further comprising:
   a main circuit board, the first circuit board comprising a companion board of the main circuit board, the main circuit board comprising a connector to electrically connect a third conductive trace on the main circuit board to the first conductive trace, the main circuit board being beyond the predefined distance and the connector being configured to position the first circuit board within the predefined distance.

9. The system of claim 1, wherein the predefined distance is between 1.5 millimeters (mm) and 3.5 mm.

10. The system of claim 2, wherein the circuitry comprises a buffer comprising an input and outputs, the buffer being configured to hold the outputs at a logic high level in response to a positive transient response and to hold the outputs at a logic low level in response to a negative transient response.

11. The system of claim 10, wherein the buffer comprises a feedback circuit from an Output of the buffer to the input; and
   wherein the buffer and the feedback circuit are configured so that the logic high level applied to the input from the feedback circuit maintains the outputs at the logic high level until the negative transient response is received at the input.

12. The system of claim 11, wherein the buffer is configured to have a propagation delay that is less than a width of the positive transient response.

13. The system of claim 11, wherein the feedback circuit is configured to provide resistance that sets a threshold for changing logic levels of the outputs of the buffer.

14. The system of claim 10, wherein the circuitry comprises:
   a multiplexer to receive an output logic level from the buffer; and
   control logic to select, for output, either the output logic level from the buffer or a signal provided by the control logic.

15. The system of claim 14, wherein the circuitry comprises:
   a flip-flop circuit to receive an output of the multiplexer, the logic circuit to control timing of the flip-flop circuit to provide the output of the multiplexer to the second circuit board at a predefined timing.

16. The system of claim 2, wherein the circuitry is configured to output a reconstructed version of at least part of the 4G digital signal using reconstructed edges; and
   wherein the circuitry comprises:
      an amplifier to increase a signal level of the transient response prior to the circuitry reconstructing the edges.

17. The system of claim 2, wherein the circuitry is configured to output a reconstructed version of at least part of the AG digital signal using reconstructed edges; and
   wherein the circuitry comprises:
      an amplifier to increase a signal level of the least part of the digital signal before output to a data bus.

18. The system of claim 1, further comprising:
   a backplane configured to connect to the first circuit board and to the second circuit board, the contactless coupling resulting from connection of the first circuit board and the second circuit board to the backplane.

19. The system of claim 2, wherein the transient response comprises a positive pulse based on the rising edge and a negative pulse based on the falling edge; and
   wherein the circuitry is configured to produce a rising edge in response to the positive pulse and a falling edge in response to the negative pulse.

20. The system of claim 1, wherein the edge corresponds to data that is passed between the first circuit board and the second circuit board; and
   wherein the first circuit board is in a first slot of a backplane and the second circuit board is in a second slot of the backplane.

21. Automatic test equipment (ATE) comprising the system of claim 1, the ATE comprising:
   a first test instrument to test a device under test (DUT), the first test instrument comprising the first circuit board;
   a second test instrument to test the DLIT, the second test instrument comprising the second circuit board, the second test instrument comprising at least part of the circuitry to reconstruct the edge; and
   a backplane connected to the first circuit board and the second circuit board.

22. Automatic test equipment (ATE) comprising the system of claim 1, the ATE comprising:
   a test instrument to test a device under test (DUT), the test instrument comprising the first circuit board and the second circuit board; and
   a backplane connected to the first circuit board and the second circuit board.

23. A method of reconstructing a digital signal having a rising edge and a falling edge, the method comprising:
   producing a first transient response corresponding to the rising edge of the digital signal, the digital signal conducting through a first conductive trace on a first circuit board and the first transient response being produced on a second conductive trace on a second circuit board, the first conductive trace and the second conductive trace being in a contactless coupling that is based on proximity of the first conductive trace and the second conductive trace, the contactless coupling enabling the second conductive trace to produce the first transient response;
   generating a logic high level in response to the first transient response;
   producing a second transient response corresponding to the falling edge of the digital signal, the second transient response being produced on the second conductive trace based on the contactless coupling; and
   generating a logic low level in response to the second transient response, thereby reconstructing at least part of the digital signal.

24. The method of claim 23, wherein the first conductive trace is terminated to reduce at least one of electromagnetic interference or electromagnetic emissions and/or to maintain digital signal fidelity; and
   wherein the second conductive trace is terminated reduce at least one of electromagnetic interference or electromagnetic emissions and/or to maintain digital signal fidelity.

25. The method of claim 24, wherein the first conductive trace is part of a first differential transmission line; and
   wherein the second conductive trace is part of a second differential transmission line.

26. The method of claim 23, wherein the method is performed by circuitry, the circuitry comprising a buffer comprising an input and outputs, the buffer being configured to hold the outputs at a logic high level in response to the first transient response and to hold the outputs to a logic low level in response to the second transient response.

27. The method of claim 26, wherein the buffer comprises a feedback circuit from an output of the buffer to the input; and
   wherein the buffer and the feedback circuit are configured so that the logic high level applied to the input from the feedback circuit maintains the outputs at the logic high level until the second transient response is received.

28. The method of claim 27, wherein the buffer is configured to have a propagation delay that is less than a width of the first transient response.

29. The method of claim 27, wherein the feedback circuit is configured to provide resistance that sets a threshold for changing logic levels of the outputs of the buffer.

30. The method of claim 23, wherein the first transient response comprises a positive pulse and the second transient response comprises a negative pulse, the first transient response and the second transient response being based on a differential signal.

31. The system of claim 1, wherein each of the first circuit board and the second circuit board comprises a reference plane connected to an electrical reference voltage.

* * * * *